United States Patent [19]
Gale et al.

[11] Patent Number: 4,464,030
[45] Date of Patent: Aug. 7, 1984

[54] DYNAMIC ACCURACY X-Y POSITIONING TABLE FOR USE IN A HIGH PRECISION LIGHT-SPOT WRITING SYSTEM

[75] Inventors: Michael T. Gale, Wettswil; Karl H. Knop, Zurich, both of Switzerland

[73] Assignee: RCA Corporation, New York, N.Y.

[21] Appl. No.: 434,317

[22] Filed: Oct. 14, 1982

[30] Foreign Application Priority Data

Mar. 26, 1982 [GB] United Kingdom ............... 8208930

[51] Int. Cl.³ ............................................ G03B 41/00
[52] U.S. Cl. .................................... 354/4; 346/76 L; 346/108; 355/53
[58] Field of Search ............... 354/4; 346/108, 76 L; 355/53, 54; 358/296, 302; 428/901

[56] References Cited

U.S. PATENT DOCUMENTS

| | | | |
|---|---|---|---|
| 3,563,648 | 2/1971 | Baggaley et al. | 355/53 X |
| 3,632,205 | 1/1972 | Marcy | 355/53 |
| 3,985,439 | 10/1976 | Kiemle | 346/76 L X |
| 4,404,569 | 9/1983 | Neumann et al. | 346/108 |
| 4,419,675 | 12/1983 | Neumann et al. | 354/4 X |
| 4,422,083 | 12/1983 | Neumann et al. | 358/296 X |

OTHER PUBLICATIONS

IBM Technical Disclosure Bulletin, "Master Artwork Generator System", Bloem et al., vol. 21, No. 9, Feb. 1979, pp. 3599–3600.

Primary Examiner—Richard A. Wintercorn
Attorney, Agent, or Firm—J. S. Tripoli; G. J. Seligsohn

[57] ABSTRACT

A commercial X-Y positioning table is modified, to limit its dynamic X-positioning error to less than ±0.05 micrometer at rates of speed in the Y direction of up to 20 millimeters per second, by mounting an X direction translation stage having fast inertial response characteristics on the Y direction stage of the positioning table and employing an interferometer controlled X position feedback circuit to provide X error compensating movement of the translation stage with respect to dynamic X position errors of the Y direction stage. This permits the generation of sub-micrometer geometry exposure patterns in photoresist for the fabrication of fine relief structures.

18 Claims, 10 Drawing Figures

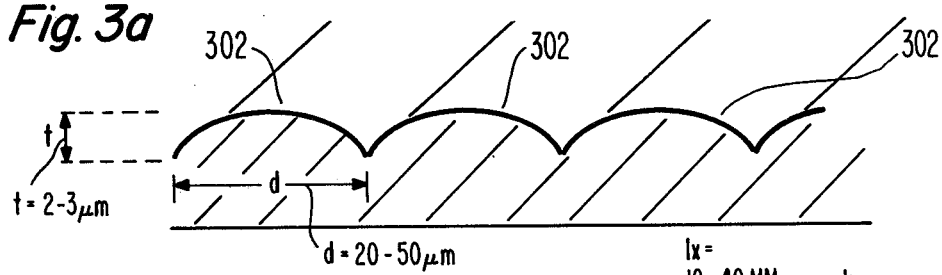
Fig. 3a MICRO-CYLINDRICAL LENS ARRAY 300
t = 2-3 μm
d = 20-50 μm
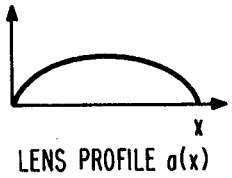
Fig. 3b LENS PROFILE σ(x)
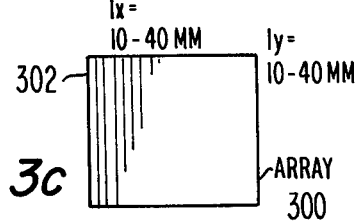
Fig. 3c lx = 10-40 MM, ly = 10-40 MM, ARRAY 300
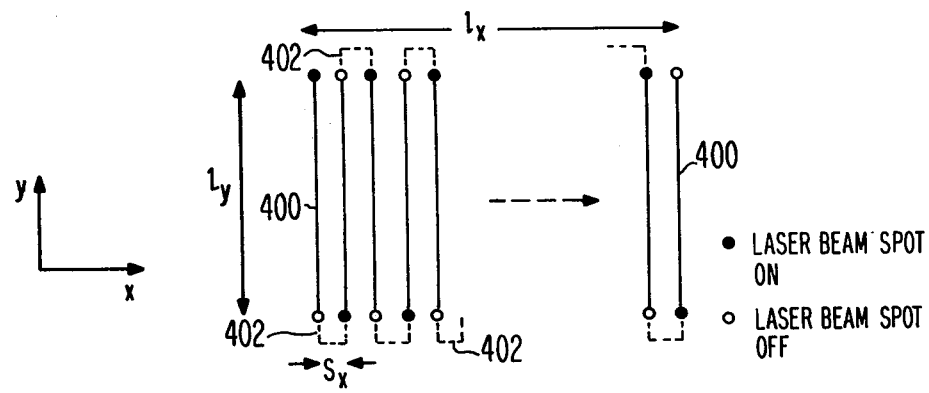
● LASER BEAM SPOT ON
○ LASER BEAM SPOT OFF
Fig. 4

DYNAMIC ACCURACY X-Y POSITIONING TABLE FOR USE IN A HIGH PRECISION LIGHT-SPOT WRITING SYSTEM

This invention relates to a technique for improving the dynamic accuracy of an X-Y positioning table and, more particularly, to a high precision laser beam writing system for the fabrication of fine relief structures and masks which incorporates such an improved X-Y positioning table.

Relatively inexpensive precision X-Y positioning tables exist in which a first stage, movable in an X direction with respect to a reference position, has mounted thereon a second stage, movable with respect to the first stage in a Y direction orthogonal to the X direction. Each of the first and second stages runs in a precision track bearing and is driven by a lead screw coupled to a motor. The respective position of each of the first and second stages is sensed by an integral optical encoder, or, for high resolution positioning, by an external Michaelson interferometer. In either case, the position information is relayed to control electronics, where it is compared to programmed command position information to obtain X and Y error signals for use as X and Y motor drive signals. By utilizing a helium-neon laser interferometer ($\lambda_{HeNe}=0.633$ micrometer), a static positioning accuracy of less than $\lambda/8$ (approximately 0.08 $\mu$m) can be realized. However, when the second stage is moving in the Y direction, dynamic X positioning errors in the X direction arise due to factors such as nonperfect bearings, dust in the bearings, vibrations, etc. Although the first stage X-motor drive feedback loop acts to correct such dynamic X-positioning errors, the speed of correction is limited by the inertial response characteristics of the X-motor and both the first and second stages of the X-Y positioning table. Measurements on typical commercial X-Y positioning tables show dynamic positioning errors in the X direction in excess of $\pm 0.2$ $\mu$m during a linear scan of the second stage in the Y direction at a speed of 4 millimeters per second and even larger errors at higher speeds. Although this relatively poor dynamic X-positioning accuracy can be possibly improved using precision air bearings for the first and second stages, this adds considerably to the cost of the system, requires an additional compressed air supply and, what is more, does not eliminate dynamic X-positioning errors due to vibration.

Fine relief structures are employed for optical and other purposes. Some fine relief structures require profiles of dimensions and profile complexity which cannot be made by mechanical machining techniques such as micro-milling or cutting using a shaped tool. By way of example, fine lenticular arrays of micro-cylindrical lenses are employed in the solid-state color-encoding television camera disclosed in U.S. Pat. No. 4,318,123, which issued to Knop on Mar. 2, 1982. Employing a metal master, such an array of micro-cylindrical lenses (each of which has a width of between 20-50 micrometers and a depth of 2-3 $\mu$m) may be hot-pressed or cast as a surface-relief pattern on a plastic sheet. As is known in the art, the desired surface-relief pattern can be first formed in a photoresist layer of a recording blank by appropriately exposing and developing the photoresist. The metal master can be then fabricated by plating the surface-relief pattern in the photoresist layer of the recorded blank.

While the width and depth of each of the micro-cylindrical lenses has microscopic dimensions, the overall dimensions of the lenticular array are macroscopic, being in the range of 10-40 millimeters. Optimum lens imaging performance requires an accurate lens profile $a(x)$ over the entire 10-40 mm length of a lens. Such an accurate lens profile $a(x)$ requires a lateral sub-micrometer X resolution (i.e., an X resolution which is very much smaller than the 20-50 $\mu$m width of a lens) in the fabrication process. Further, other fine relief profiles (such as those employed in relief grating structures used as optical filters or beam splitters, and for the fabrication for high precision grating masks) also require sub-micrometer geometry control.

A commercial X-Y positioning table is not capable of the sub-micrometer geometry control required to generate accurate fine relief profiles of the type discussed above. However, in accordance with the principles of the present invention, even a relatively low-cost X-Y positioning table may be modified to provide such sub-micrometer geometry control and thereby make possible a high precision laser beam writing system for the fabrication of fine relief structures.

Briefly, in accordance with the present invention, a translation stage is mounted on the second stage of an otherwise commercial X-Y positioning table (which second stage is movable with respect to the first stage of the positioning table in a Y direction). The translation stage includes electro-mechanical drive means (e.g., piezo-electric or loudspeaker drive means) for moving the translation stage with respect to the second stage in the X direction in accordance with a variable parameter of a given control signal applied to the drive means. The translation stage has given inertial response characteristics to movement thereof in the X direction. The given control signal, which is applied to the drive means, is derived by control means which include an interferometer having a mirror attached to the translation stage, which mirror is illuminated with and reflects a beam of coherent wave enegy along an optical path extending in the X direction. The parameter of the given control signal varies with changes in the length of the optical path in the X direction to effect a compensating movement in the X direction of the translation stage with respect to the second stage at a rate which depends upon the given inertial response characteristics of the translation stage. The compensating movement of the translation stage in the X direction is opposite to any dynamic positioning error movement of the second stage in the X direction while the second stage is being moved in the Y direction. Further, the given inertial response characteristics of the translation stage is sufficiently fast to permit the given control signal to maintain control of the X position of the translation stage with respect to that of a reference position with a dynamic positioning accuracy higher than the dynamic positioning accuracy of the second stage with respect to the reference position, while the second stage is moving with respect to the first stage in the Y direction.

By fixedly mounting a recording blank coated with a layer of photoresist on the translation stage, and illuminating the photoresist with a focused spot of an intensity modulated light (which may be derived from a laser beam) which is fixed with respect to the reference position, and then controlling the respective movements of the first and second stages of an X-Y positioning table in synchronism with the intensity modulation of the focused spot of light, a selected fine relief profile pattern can be generated in the exposed photoresist layer.

In the drawings:

FIGS. 1 and 1a schematically illustrate a prior-art laser beam writing system incorporating a relatively inexpensive precision X-Y table for the fabrication of relatively coarse relief structures;

FIGS. 3a, 3b and 3c illustrate the geometry of a lenticular array of micro-cylindrical lenses;

FIG. 4 illustrates the X and Y positioning movement required of the laser beam writing system shown in FIGS. 1 and 1a in order to generate the lenticular array of micro-cylindrical lenses shown in FIGS. 3a, 3b and 3c;

Figure 1:
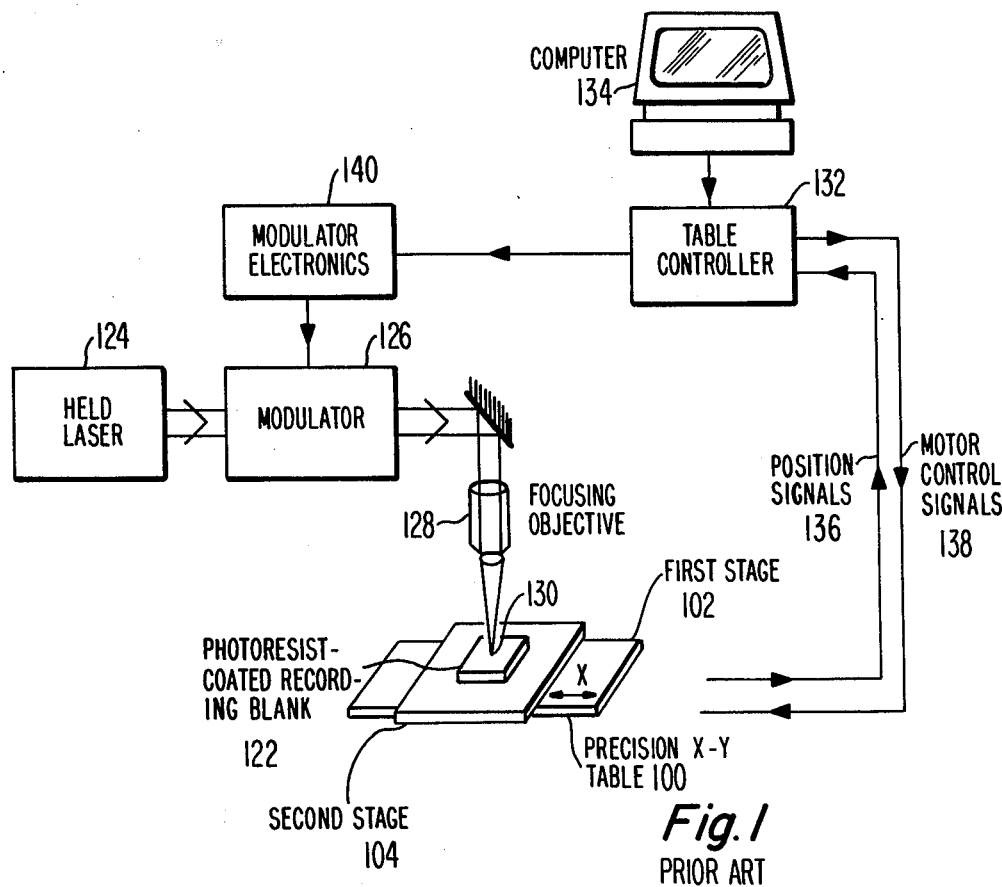
Figure 1A:
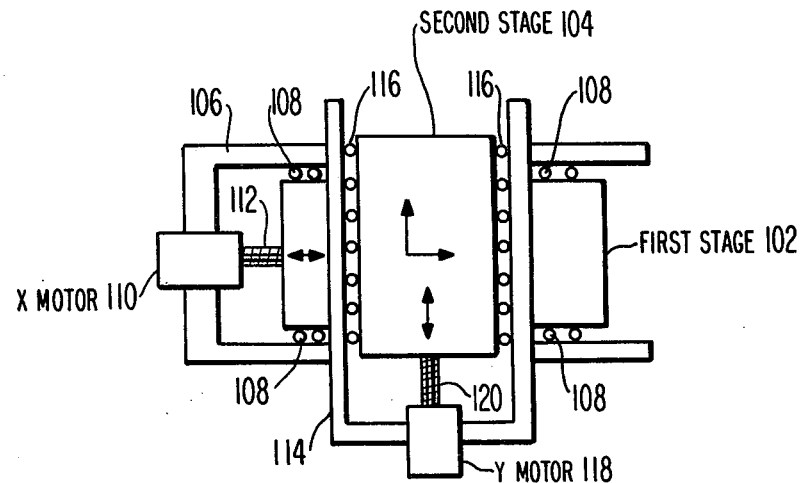
Figure 5:
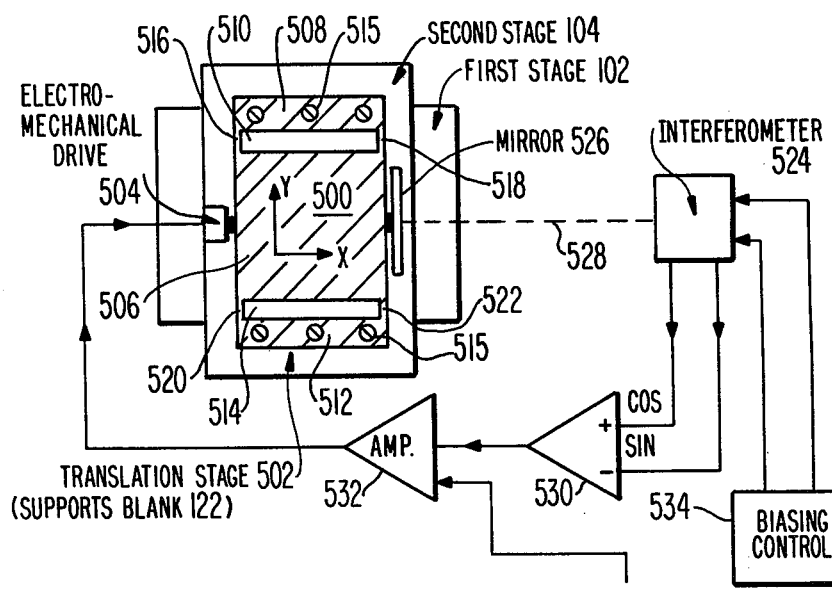
Figure 6:
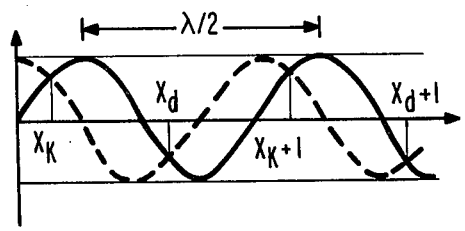
Figure 7:
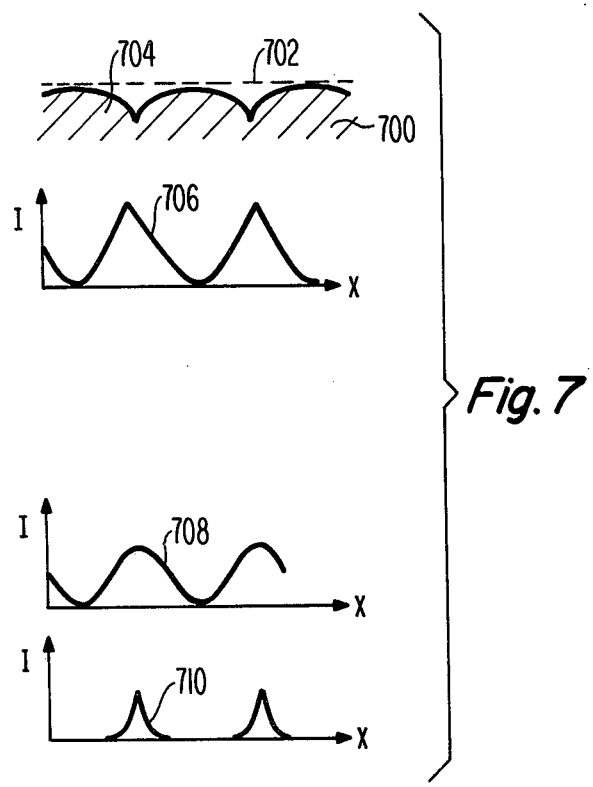

FIG. 5 schematically illustrates a modification of the laser beam writing system shown in FIGS. 1 and 1a in accordance with the principles of the present invention, which modification converts the laser beam writing system shown in FIGS. 1 and 1a into a high precision laser beam writing system for the successful fabrication of fine relief structures, such as the lenticular array of micro-cylindrical lenses shown in FIGS. 3a, 3b and 3c;

FIG. 6 is a plot of the variation in the input signals to the differential amplifier shown in FIG. 5 as a function of the change in optical path length measured by the interferometer shown in FIG. 5, which plot is helpful in describing the operation of the modification shown in FIG. 5; and FIG. 7 illustrates a preferred mode of operation of the laser beam writing system shown in FIGS. 1 and 1a, modified as shown in FIG. 5, in generating the proper profile of a lenticular array of micro-cylindrical lenses in the surface of the photoresist coated recording blank shown in FIG. 1.

Referring to FIG. 1, there is shown a relatively low cost precision X-Y table 100, which is comprised of a first stage 102 movable with respect to a reference position in an X direction, and a second stage 104 mounted on the first stage 102 which is movable with respect to the first stage in a Y direction orthogonal to the X direction. As shown in more detail in FIG. 1a, first stage 102 of relatively inexpensive X-Y positioning table 100 is disposed within frame 106 by bearings 108 for movement in the X direction. Frame 106, which is fixed with respect to a reference position, supports X motor 110 which includes a lead screw 112 attached to first stage 102 to effect the movement of first stage 102 in the X direction in accordance with the operation of X motor 110. First stage 102 supports frame 114 in which second stage 104 is disposed by bearings 116 for movement in the Y direction with respect to first stage 102. Frame 114 supports Y-motor 118 which includes lead screw 120 attached to second stage 104 for effecting movement of second stage 104 with respect to first stage 102 in the Y direction in accordance with the operation of Y-motor 118.

Returning to FIG. 1, there is shown a photoresist-coated recording blank 122 supported by second stage 104. Blank 102 includes a suitable substrate, such as glass, coated with a layer of a suitable photoresist. For purposes of the present invention, suitable photoresists comprise high resolution positive photoresists, such as Shipley AZ or Waycoat HPR Series. A beam of light from helium cadmium laser 124 is intensity-modulated by modulator 126 and is focused by microscope objective 128 into an intensity-modulated focused light spot 130 which is incident on and exposes the photoresist layer of blank 122 by an amount which is a function of both the intensity of spot 130 and the rate of speed of movement of second stage 104.

Table controller 132 is supplied with a command input which includes X and Y position command signals and a light-intensity command signal. This command input to table controller 132 may be supplied directly from computer 134 as shown in FIG. 1, or, alternatively, the command signals making up this command input may be obtained from a stored source, such as a magnetic tape, punch cards, etc. Table controller 132 also includes a feedback input which is supplied with X and Y position signals 136 indicative of the respective instantaneous positions of first stage 102 and second stage 104. As is known in the art, position signals 136 may be sensed employing position encoders, such as optical position encoders, attached respectively to stage 102 and second stage 104, or, for high-resolution position sensing, the respective positions of first stage 102 and second stage 104 may be sensed with X and Y interferometers. In any case, table controller 132 includes a servo-mechanism for comparing the respective actual X position of first stage 102 and actual Y position of second stage 104, as indicated by position signals 136, with the X and Y position command signals from computer 134 in order to derive motor control signals 138 which are applied to respective X-motor 110 and Y-motor 118 to cause respective first stage 102 and second stage 104 to accurately execute the X and Y position commands. Table controller 132, in response to a light-intensity command signal applied thereto from computer 134, applies a modulating signal to modulator 126 through modulator electronics 140. In this manner, the X and Y position command signals and the light-intensity command signal control the light exposure pattern generated on the surface of a photoresist layer of blank 122. This exposure pattern is converted to a corresponding surface-relief pattern in the photoresist layer of recording blank 122 by developing the photoresist, as is known in the art.

Figure 2:
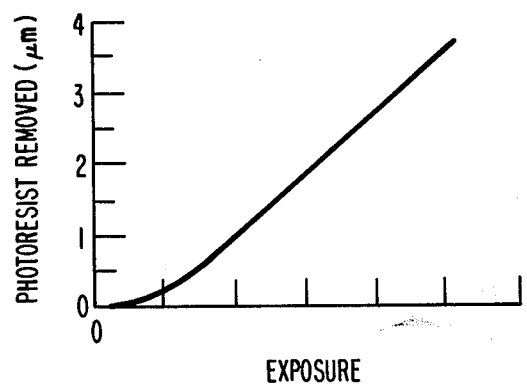
FIG. 2 is a graph illustrating the functional relationship between the exposure of a typical photoresist to light and the amount of photoresist removed.

In particular, reference is made to FIG. 2 which shows a graph of the amount of photoresist removed in micrometers, from a typical high-resolution positive photoresist, as a function of the exposure (in arbitrary units) of the photoresist. As indicated in FIG. 2, the rate of photoresist removal is relatively small and varies non-linearly with exposure at small exposure levels. However, at higher exposure levels, the rate of photoresist removal is relatively high and remains constant with increasing exposure. In any case, the photoresist removal may be plotted against exposure (in the manner similar to that shown in FIG. 2) for any particular photoresist, thereby providing a calibration curve useful in determining the required exposure to achieve a desired depth of photoresist removal for that particular photoresist.

An example of the type of fine surface-relief pattern with which the present invention is concerned is the lenticular array of micro-cylindrical lenses shown in FIG. 3a. As indicated in FIG. 3a, the lenticular array of micro-cylindrical lenses comprises a plurality of substantially identical parallel contiguous cylindrical lenses 300. As indicated in FIG. 3a, each of lenses 300 is a micro-cylindrical lens having a width d of between 20–50 $\mu$m and a peak depth t of between 2–3 $\mu$m. FIG. 3b shows a plot of the lens profile a(x), with the value of the depth dimension a being plotted against the width dimension X. As indicated in FIG. 3c, each of the respective overall dimensions of array 300 is between 10-40 millimeters. Thus, the length of each microcylindrical lenses 302 is vastly greater than the 20-50 μm width dimension d thereof (the length of each lens 302 being between 200-2000 times longer than the width d thereof). Similarly, the number of contiguous lenses 302 in the array is large (being between 200-2000).

FIG. 4 illustrates the required positioning movement of the respective first stage 102 and second stage 104 in order to generate the exposure pattern for array 300. Specifically, each of the vertical lines 400 shown in FIG. 4 corresponds to a sample point on the overall width dimension of $l_x$ (i.e., 10-40 mm). Each of the solid vertical lines 400 is indicative of the second stage 104 being moved with respect to the first stage 102 in the Y direction the entire length $l_y$ of the lens 302 of array 300 (i.e., 10-40 mm) with the laser beam spot on. At the end of each sample, the laser beam spot is turned off, the first stage 102 and the second stage 104 are operated to move blank 122 with respect to the reference position along a path indicated by one of the dotted lines 402 (FIG. 4) to the X position of the next sample. As indicated in FIG. 4, the spacing distance in the X direction between successive samples is $S_x$. $S_x$ has a value between 0.5-1 μm, which is slightly smaller than the diameter of focused light spot 130, so that adjacent line exposures overlap to give a smooth final profile. More specifically, the intensity of focused light spot 130 during the occurrence of each sample line 400 is selected in accordance with (1) that required by the appropriate sample points on the lens profile of FIG. 3b, (2) the rate of speed in the Y direction of second stage 104, and (3) the exposure-photoresist removal calibration graph of FIG. 2, in order to provide a proper exposure for each individual exposure line 400 that results in an exposure pattern of a photoresist layer of blank 122 which, upon development of the photoresist, generates the surface-relief pattern of array 300.

The above discussion assumes ideal performance of precision X-Y table 100 in executing each of sample lines 400. In practice, by employing a helium-neon laser interferometer to control the generation of X and Y feedback position signals 136, a static accuracy of about ±0.08 μm can be achieved in positioning each of first stage 102 and second stage 104. However, the generation of each of sample lines 400 requires that second stage 104 be continuously moved with respect to first stage 102 in the Y direction, while the X position of first stage 102 remains fixed with respect to a reference position. The dynamic accuracy with which the X position of second stage 104 can be controlled while second stage 104 is moving with respect to first stage 102 in the Y direction depends on both the inertial response characteristics of X-Y table 100 and the rate of speed with which second stage 104 is being moved with respect to first stage 102 in the Y direction. An array in which $l_x$ is 10-40 mm and $S_x$ is only 0.5-1 μm requires between 10,000 and 80,000 sample lines 400. Since the length $l_y$ of each sample line 400 is also 10-40 mm, second stage 104 must be moved with respect to first stage 102 in the Y direction at a significant rate of speed in order to write an entire array exposure pattern in an acceptable amount of time. For instance, assuming a minimum area array of 10×10 mm and a maximum sample line spacing $S_x$ of 1 μm, it would take about 6 hours to write the exposure pattern on blank 122 at a typical rate of speed of movement of second stage 104 with respect to first stage 102 in the Y direction of about 5 mm/sec. However, at speeds of only about 4 mm/sec, the dynamic X-positioning error of typical commercial X-Y positioning tables are in excess of ±0.2 μm during a linear scan of a 10 μm sample line 400.

The proper optical performance of array 300 is very strongly dependent upon the straightness and exact spacing of sample lines 400. More specifically, a dynamic X-positioning accuracy of better than 0.05 μm must be maintained in the line scan of each sample line 400 at practical writing speeds (typically in the range 10-20 mm/sec) in order to achieve a lenticular array 300 exhibiting proper optical properties of performance. Therefore, in practice, the prior art system shown in FIG. 1 is incapable of providing a high precision laser beam writing system for the successful fabrication of fine relief structures, such as array 300 (although the laser beam writing system of FIG. 1 can be employed for the successful fabrication of relatively coarse relief structures).

In accordance with the principles of the present invention, the laser beam writing system shown in FIG. 1 can be modified in the manner illustrated in FIG. 5 to provide a high precision laser beam writing system for the successful fabrication of fine relief structures, such as array 300. As indicated in FIG. 5, the recording blank 122 is not supported directly by second stage 104 (as is the case in FIG. 1). Instead, blank 122 is supported by the table portion 500 of translation stage 502, which translation stage 502 is mounted on second stage 104. Translation stage 502 also includes electro-mechanical drive 504, such as a piezo-drive or loudspeaker drive, for moving table portion 500 of translation stage 502 with respect to second stage 104 in the X direction.

A piezo-electric drive element provides a more rigid and stiffer coupling between the second stage and the translation than does an electro-magnetic drive, such as a loudspeaker drive element. The softer coupling of the loudspeaker drive element permits even greater dynamic accuracy to be achieved than can be achieved with a piezo-electric drive element, and is therefore to be preferred. However, both these approaches and other functionally similar electro-mechanical drive means are within the scope of the present invention.

More specifically, translation stage table 500 is comprised of a metal central region 506 separated from rear region 508 by cut-out 510 and from front region 512 by cut-out 514. Rear and front regions 508 and 512 are held in fixed relationship with respect to second stage 104 by fasteners 515. As indicated in FIG. 5, upper region 508 is connected to central region 506 by lamellar joints 516 and 518 located, respectively, at the left and right edges of cut-out 510. Similarly, lower region 512 is connected to central region 506 by lamellar joints 520 and 522 located, respectively, at the left and right edges of cut-out 514. The four lamellar joints 516, 518, 520 and 522 permit a very smooth and rotation-free limited movement in the X direction of central region 506 by elastic deformation of these four lamellar joints. Electro-mechanical drive 504, which is attached to the middle of central region 506 of table 500, provides such limited movement of central region 506 in the X direction with respect to second stage 104.

Also shown in FIG. 5 is Michaelson interferometer 524 which includes a mirror 526 mounted on central portion 506 of the translation stage 502. Mirror 526 is oriented with its face normal to the X direction. Interferometer 524 also includes a source of coherent wave energy (e.g., a helium-neon laser) for illuminating mirror 526 with coherent wave energy traveling in the X direction along optical path 528. Therefore, coherent wave energy reflected by mirror 526 travels back to interferometer 524 along the same optical path 528. Interferometer 524 further includes means for measuring changes in the length of optical path 528 by interfering the reflected beam of coherent wave energy with a reference beam of this coherent wave energy. Specifically, a coarse sinusoidal grating pattern can be produced by interferometer 124 by interfering the two beams at a small angle (instead of absolutely parallel). Interferometer 124 may include two photo-sensors placed at respective appropriate positions in this grating pattern which are separated by a distance equal to an odd number of quarter-wavelengths of this coarse sinusoidal grating pattern, to derive two separate signals as electrical outputs of interferometer 524. The respective relative levels of these two electrical output signals are proportional to $\cos(4\pi x/\lambda)$ and $\sin(4\pi x/\lambda)$, where $\lambda$ is the wavelength of the coherent wave energy ($\lambda = 633$ nanometers for He-Ne laser) and X is the length of optical path 528 measured in the same units as $\lambda$.

More specifically, the two electrical outputs of interferometer 524 are applied respectively as the "plus" and the "minus" inputs to differential amplifier 530. The output of differential amplifier 530 is applied through drive amplifier 532 as the energization signal to electro-mechanical driver 504 which drives central region 506 of table 500 of translation stage 502. Cascaded differential amplifier 530 and drive amplifier 532 together comprise a high gain feedback loop. The allowed stable X positions of driven translation stage 502 (and hence, that of recording blank 122 supported thereby) with respect to a reference position (with such a high gain feedback loop driving electro-mechanical drive 504) is given by the solutions of the equation $\cos(4\pi x/\lambda) = \sin(4\pi x/\lambda)$. As indicated in FIG. 6, two sets of stable X positions with respect to the reference position are obtained, depending on the sign of the overall gain of the feedback loop. Specifically, for positive gain, $x_k = (k+\frac{1}{4})\lambda/2$ and, for negative gain, $x_j = (j-\frac{1}{4})\lambda/2$, where k and j, respectively, are any integer. As indicated in FIG. 6, the spacing between discrete x values, $\lambda/2$, is comparable to the smallest focus size of focused light spot 130, and, therefore, for most applications provides sufficient X positioning resolution. However, if positioning at any arbitrary X-value is required, this can be accomplished by means of biasing control 534.

A preferred way of accomplishing this is to employ a piezo-electric element in interferometer 524 for offsetting the X position from a reference position of an interferometer mirror in accordance with a bias signal from biasing control 534. Alternatively, biasing control 534 can apply a preselected relative bias level difference between the "plus" and the "minus" inputs to differential amplifier 530. In either case, the maximum difference in level due to the bias signal of the two inputs to differential amplifier 530 at the reference X position of the interferometer mirror must be less than the peak-to-peak amplitudes of the two sinusoidal electrical outputs from interferometer 524. This ensures that at some selected point in the spacing distance of $\lambda/2$ a stable X position of translation stage 502 with respect to the reference position results.

It is essential that during the movement of first stage 102, from one sampled X position to the next, interferometer 524 be rendered ineffective in controlling the movement of translation stage 502. This is easily accomplished by applying a control input from table controller 132 to amplifier 532 so that the energization signal to electro-mechanical drive 504 is switched off (set to zero) to effect the return of translation stage 502 to a home position while first stage 102 is being moved along path 402 under the control of table controller 132 from one X sampling position to the next. Further, care must be taken to assure that the energization signal is only switched on again when the X positional error in the home position of translation stage 502 is sufficiently small so that the active stabilization cannot get locked to the wrong $x_k$ or $x_j$ value when active stabilization by interferometer 524 is resumed for the next X sample.

The following table illustrates the improved performance of a relatively low cost commercial X-Y table equipped with the modification shown in FIG. 5, compared to that of the unmodified X-Y table shown in FIG. 1 (assuming that interferometer control is utilized to generate the X position signals 136 of the unmodified table). Maximum dynamic X positioning errors are shown in the following tables. These maximum dynamic X position errors, for each of the various rates of Y writing speed, occur predominantly at relatively high frequencies (approximately 200 Hz). The improvement in the low-frequency dynamic X positioning accuracy achieved by utilizing the present invention is an order of magnitude better than that shown in the tables.

TABLE I

| SPEED IN Y DIRECTION OF SECOND AND TRANSLATION STAGES | DYNAMIC X POSITIONING ERRORS OF SECOND STAGE | DYNAMIC X POSITIONING ERRORS OF TRANSLATION STAGE (piezo-drive) |
|---|---|---|
| 4 mm/sec | ± .24 μm | ± .03 μm |
| 2 | .16 | .02 |
| 1 | .13 | .02 |
| 0.5 | .09 | .02 |

TABLE II

| SPEED IN Y DIRECTION OF SECOND AND TRANSLATION STAGES | DYNAMIC X POSITIONING ERRORS OF SECOND STAGE | DYNAMIC X POSITIONING ERRORS OF TRANSLATION STAGE (loudspeaker drive) |
|---|---|---|
| 20 mm/sec | ± 0.9 μm | ± 0.050 μm |
| 10 | 0.5 | 0.015 |
| 4 | 0.240 | 0.008 |
| 1 | 0.130 | 0.008 |

In the description of FIG. 4 above, it is assumed that the exposure pattern for array 300 is achieved in a single pass of focused spot 130 over the area of the array. However, as shown by the curves of FIG. 7, a two-pass recording technique is capable of providing a higher fidelity surface-relief pattern in the developed exposed photoresist. Specifically, to achieve a high fidelity surface relief pattern, it is essential that exactly that portion of the original layer of photoresist 700 occupying the area between dotted line 702 and surface-relief profile 704 of the lenticular array be removed during the development of the exposed photoresist. Curve 706 illustrates the relative light-intensity of a single-pass exposure pattern that is required (taking into consideration the exposure calibration curve shown in FIG. 2) to obtain, upon photoresist development, the surface-relief profile 704. Curve 706 is comprised of a series of relatively broad-based cusps each of which has a relatively sharp apex. It is difficult, if not impossible, to provide a focused spot of light which is capable, in a single-pass, of providing variable illumination of an intensity which exactly follows intensity curve 706. More specifically, intensity curve 706 puts diverging requirements on the size of focus of spot 130. On one hand, the smallest possible focus is desirable to be able to expose a sharp edge between individual lenslets. On the other hand, a large focus, which leads to overlapping exposures between adjacent scan lines, yields a smoother surface. Both requirements are about equally important to generate a lenticular array of the proper profile 704 to insure good optical quality.

A two-pass technique overcomes this problem of diverging requirements. During a first pass, microscope objective 128 is moved out of focus so as to provide a coarse focus of about 5 $\mu$m. This results in the generation of a first-pass exposure pattern having the shape defined by intensity curve 708. During the second pass, microscope objective 128 is moved into focus so as to provide its finest spot size of about 1 $\mu$m (which corresponds to the diffraction limit given by the magnification of microscope objective 128 and the laser beam diameter). The second-pass exposure pattern has a shape defined by intensity curve 710. The total exposure pattern is the sum of the exposure patterns of intensity curves 708 and intensity curve 710. The sum exposure pattern approximates the ideal exposure pattern shown in intensity curve 706. The use of respective fine and coarse foci of 1 and 5 $\mu$m during each of two passes, provides the lenticular array surface-relief profile 704 with a period of about 40 $\mu$m and a depth of about 2 $\mu$m, which profile shape is sufficiently close to the ideal to be capable of performing with good optical quality.

The optical quality of lenticular arrays can be measured by analyzing their focusing properties. Any deviation from an ideal shape of the lens results in stray light (light which is not focused). Stray light is also produced by diffraction. The optical quality of a lenticular array of the type discussed is markedly improved when fabricated employing the principles of the present invention, (i.e., the commercial X-Y table modified in accordance with FIG. 5 and the use of the two-pass recording technique described above). The total amount of stray light is reduced from about 30% without employing the present invention to only about 15%, when the present invention is employed. 15% stray light is close to the diffraction limit of 11% of lenticular arrays of microcylindrical lenses having the typical dimensions discussed above.

The high precision laser beam writing system of the present invention is not limited to the fabrication of lenticular lens array, but may be employed for the fabrication of other fine relief structures having very different types of profiles from that employed by a lenticular lens array. For instance, the high-precision laser writing system of the present invention can be used to great advantage in fabricating the fine relief structures taught in U.S. Pat. No. 4,079,411, which issued Mar. 14, 1978 to Engelbrecht and Knop.

What is claimed is:

1. In combination with (1) an X-Y positioning table comprising a first stage movable with respect to a reference position in an X direction and a second stage mounted on said first stage and movable with respect to said first stage in a Y direction orthogonal to said X direction and (2) first control means coupled to said first and second stages of said X-Y positioning table for controlling the positioning of said second stage with respect to said reference position in both said X direction and said Y direction, said first control means being capable of maintaining control of the X position of said second stage with respect to said reference position with a first dynamic positioning accuracy while said second stage is moving with respect to said first stage in said Y direction; the improvement comprising:

a translation stage mounted on said second stage and including electro-mechanical drive means for moving said translation stage with respect to said second stage in said X direction in accordance with a variable parameter of a given control signal applied to said drive means, said translation stage having given inertial response characteristics to movement thereof in said X direction;

second control means for deriving and applying said given control signal to said drive means, said second control means including an interferometer having a mirror attached to said translation stage which mirror is illuminated with and reflects a beam of coherent wave energy along an optical path extending in said X direction, said parameter of said given control signal varying with changes in the length of said optical path in said X direction to effect a compensating movement in said X direction of said translation stage with respect to said second stage at a rate dependent on said given inertial response characteristics of said translation stage, said compensating movement of said translation stage in said X direction being opposite to any dynamic positioning error movement of said second stage in said X direction while said second stage is being moved in said Y direction; and said given inertial response characteristics of said translation stage being sufficiently fast to permit said given control signal to maintain control of the X position of said translation stage with respect to said reference position with a second dynamic positioning accuracy which is higher than said first dynamic positioning accuracy, while said second stage is moving with respect to said first stage in said Y direction.

2. The combination defined in claim 1, wherein: said given rate of speed of said second stage in said Y direction is in a range between 0.5 and 20 millimeters per second, and said first dynamic positioning accuracy is such that said second stage produces dynamic positioning errors in its X position of at least $\pm 0.9$ micrometer when said second stage is moving in said Y direction at 20 millimeters per second; and said given inertial response characteristics of said translation stage providing second dynamic positioning errors in its X position of no more than $\pm 0.05$ micrometer when said second stage is moving in said Y direction at any speed up to 20 millimeters per second.

3. The combination defined in claim 2, wherein: said first dynamic positioning accuracy is such that said second stage exhibits a dynamic positioning error in its X position of substantially $\pm 0.09$, $\pm 0.13$, $\pm 0.16$ and $\pm 10.24$ micrometer, respectively, when said second stage is moving in said Y direction at 0.5, 1, 2 and 4 millimeters per second, respectively; and said given inertial response characteristics of said translation stage produces dynamic errors in its X position of no more than ±0.02, ±0.02, ±0.02 and ±0.03 micrometer, respectively, when said second stage is moving in said Y direction at 0.5, 1, 2 and 4 millimeters per second, respectively.

4. The combination defined in claim 3, wherein:
said given inertial response characteristics of said translation stage produces dynamic errors in its X position of no more than ±0.008 micrometer, when said second stage is moving in said Y direction at no more than 4 millimeters per second.

5. The combination defined in claim 1, wherein said first control means controls the positioning of said second stage with respect to said reference position in both said X direction and said Y direction by controlling the movement of said first stage in said X direction while maintaining said second stage fixed with respect to said first stage and by controlling the movement of said second stage with respect to said first stage in said Y direction while maintaining said first stage fixed with respect to said reference position.

6. The combination defined in claim 5, wherein said second control means includes signal control means coupled to said first control means for permitting said parameter of said given control signal to vary with changes in the length of said optical path of said interferometer coherent wave energy beam only while said first stage remains fixed with respect to said reference position and for independently varying said parameter of said given control signal when said first stage is being moved in said X direction to effect a return of said translation stage to a selected home position on said second stage.

7. The combination defined in claim 1, wherein:
said interferometer includes means for deriving a sinusoidal first signal which varies as $\cos(4\pi x/\lambda)$ with said optical path length and a sinusoidal translation signal which varies as $\sin(4\pi x/\lambda)$ with said optical path length, where x is the X position of said second stage with respect to said reference position and $\lambda$ is the wavelength of said coherent wave energy beam; and said signal control means includes signal translation means responsive to the algebraic difference in amplitude between said first and second signals for deriving said given control signal.

8. The combination defined in claim 7, wherein said signal translation means includes a differential amplifier having said first and second signals applied as inputs thereto.

9. The combination defined in claim 8, wherein said signal translation means further includes a drive amplifier for amplifying the output of said differential amplifier, said given control signal appearing at the output of said drive amplifier.

10. The combination defined in claim 8, wherein:
said sinusoidal first and second signals have substantially the same given peak-to-peak amplitude; and
said signal control means includes biasing means for placing the inputs of said differential amplifier at a selected difference level having a value between the peaks of said given peak-to-peak amplitude at said reference position in said X direction.

11. The combination defined in claim 8, wherein:

said first control means controls the positioning of said second stage with respect to said reference position in both said X direction and said Y direction by controlling the movement of said first stage in said X direction while maintaining said second stage fixed with respect to said first stage and by controlling the movement of said second stage with respect to said first stage in said Y direction while maintaining said first stage fixed with respect to said reference position; and said signal control means includes means for de-energizing said electro-mechanical drive means while said first stage is moving in said X direction with respect to said reference position.

12. A high precision light-spot writing system suitable for the fabrication of fine relief structures, said system comprising:

an X-Y positioning table including a first stage movable in an X direction with respect to a reference position, a second stage mounted on said first stage and movable with respect to said first stage in a Y direction that is orthogonal to said X direction, and a translation stage mounted on said second stage and incorporating electro-mechanical drive means for moving said translation stage with respect to said second stage in said X direction;

a recording blank fixedly mounted on said translation stage, said blank being coated with a layer of photoresist;

means for illuminating said photoresist with a focused spot of intensity-modulated light which is fixed with respect to said reference position;

first control means including a table controller for controlling the X positioning of said first stage with respect to said reference position and the Y positioning of said second stage with respect to said first stage with certain dynamic positioning accuracies in accordance with X and Y position command signals applied as inputs to said table controller, and for controlling the intensity-modulation of said focused spot of photoresist-illuminating light in accordance with a light-intensity command signal applied as an input to said table controller while said first and second stages are being positioned, thereby to record an exposure pattern in said photoresist which is determined both by (1) said X and Y position command signals and said light-intensity command signal and (2) by the dynamic positioning accuracies with which the positioning of the first and second stages can be controlled;

second control means, including an interferometer having a mirror attached to said translation stage which mirror is illuminated with and reflects a beam of coherent wave energy along an optical path extending in said X direction for deriving and applying a translation stage control signal to said electro-mechanical drive means, said translation stage control signal having a parameter which varies with changes in the length of said optical path in said X direction to effect a compensatory movement in said X direction of said translation stage with respect to said second stage at a rate dependent on the inertial response characteristics of said translation stage, said compensatory movement of said translation stage in said X direction being opposite to dynamic positioning error movement of said second stage in said X direction while said second stage is being moved in said Y direction; and said inertial response characteristics of said translation stage being sufficiently fast to permit said translation stage control signal to maintain control of the X position of said translation stage with respect to said reference position with a dynamic positioning accuracy which is higher than the dynamic positioning accuracy of said second stage in said X direction, while said second stage is moving with respect to said first stage in said Y direction.

13. The system defined in claim 12, wherein said inertial response characteristics of said translation stage provides said system with a dynamic positioning accuracy such that said translation stage produces positioning errors in its X position of no more than ±0.05 micrometer when said second stage is moving in said Y direction at any speed up to 20 millimeters per second.

14. The system defined in claim 13, wherein:
said table controller controls the respective positioning of said first and second stages only one at a time, whereby said second stage remains fixed with respect to said first stage while said first stage is being positioned in said X direction with respect to said reference position and said first stage remains fixed with respect to said reference position while said second stage is being positioned in said Y direction with respect to said first stage; and said second control means is coupled to said table controller and is responsive to said first stage being positioned in said X direction for controlling said parameter of said translation stage control signal to the exclusion of said interferometer thereby to effect the return of said translation stage to a selected home position on said second stage.

15. The system defined in claim 14, wherein said table controller operates to turn said illuminating light substantially off while said first stage is being positioned in said X direction with respect to said reference position and to permit said photoresist to be exposed to said focused spot of intensity-modulated light only while said second stage is being positioned with respect to said first stage.

16. The system defined in claim 15, wherein said table controller alternatively positions each of said first and second stages a plurality of times, with said second stage being moved each time a distance with respect to said first stage in said Y direction in a range of between 10–40 millimeters and said first stage being moved each time a distance in said X direction in a range of between 0.5–1 micrometer, whereby said exposure pattern comprises a plurality of closely spaced parallel lines each of which extends in said Y direction.

17. The system defined in claim 16, wherein said table controller moves said first stage in said X direction substantially the same given distance each time, whereby said parallel lines are substantially equally spaced.

18. The system defined in claim 16, wherein the rate of speed of said second stage with respect to said first stage in said Y direction is in a range between 0.5 and 20 millimeters per second, and the dynamic positioning error in X position of said second stage with respect to said reference position is at least ±0.9 micrometer when said second stage is moving in said Y direction at 20 millimeters per second; and said inertial response characteristics of said translation stage with respect to said reference position providing dynamic positioning errors in its X position of no more than ±0.05 micrometer when said second stage is moving in said Y direction at any speed up to 20 millimeters per second.

* * * * *